United States Patent
Quilligan et al.

(10) Patent No.: US 7,183,958 B2
(45) Date of Patent: Feb. 27, 2007

(54) SUB-RANGING DIGITAL TO ANALOG CONVERTER FOR RADIOFREQUENCY AMPLIFICATION

(75) Inventors: Gerard T. Quilligan, Limerick (IE); Pierce J. Nagle, Cork (IE); Eugene P. Heaney, Cork (IE)

(73) Assignee: M/A-Com, Eurotec B.V., Cork (IE)

( * ) Notice: Subject to any disclaimer, the term of this patent is extended or adjusted under 35 U.S.C. 154(b) by 0 days.

(21) Appl. No.: 10/935,952

(22) Filed: Sep. 8, 2004

(65) Prior Publication Data

US 2006/0049971 A1    Mar. 9, 2006

(51) Int. Cl.
    *H03M 1/66*    (2006.01)
(52) U.S. Cl. ...................... 341/144; 341/145
(58) Field of Classification Search ............... 341/144, 341/145, 141, 118, 136, 153; 600/547; 315/364; 345/98
    See application file for complete search history.

(56) References Cited

U.S. PATENT DOCUMENTS

| | | | |
|---|---|---|---|
| 3,400,257 A | 9/1968 | Smith | |
| 4,340,856 A * | 7/1982 | Orlandi | 714/735 |
| 4,430,642 A * | 2/1984 | Weigand et al. | 341/141 |
| 4,534,040 A | 8/1985 | Thapar | 375/39 |
| 4,580,111 A | 4/1986 | Swanson | 332/41 |
| 4,739,304 A | 4/1988 | Takeda et al. | |
| 4,804,931 A | 2/1989 | Hulick | 332/31 R |
| 4,947,455 A | 8/1990 | Swanson | 455/115 |
| 4,952,890 A | 8/1990 | Swanson | 332/152 |
| 4,998,108 A * | 3/1991 | Ginthner et al. | 341/145 |
| 5,017,918 A * | 5/1991 | Matsusako | 341/118 |
| 5,101,204 A | 3/1992 | Matsusako | |
| 5,138,319 A | 8/1992 | Tesch | |
| 5,204,589 A * | 4/1993 | Koblitz | 315/364 |
| 5,268,658 A | 12/1993 | Edwards | 332/151 |
| 5,367,272 A | 11/1994 | Hulick | 332/149 |
| 5,392,007 A | 2/1995 | Cripe | 332/149 |
| 5,450,044 A | 9/1995 | Hulick | 332/103 |
| 5,469,127 A | 11/1995 | Hulick et al. | 332/149 |
| 5,621,351 A | 4/1997 | Puri et al. | 330/10 |
| 5,663,728 A * | 9/1997 | Essenwanger | 341/153 |
| 5,867,071 A | 2/1999 | Chethik | 332/103 |
| 5,886,573 A | 3/1999 | Kolanek | 350/10 |
| 6,038,470 A * | 3/2000 | Ploetz et al. | 600/547 |
| 6,041,082 A | 3/2000 | Takeda et al. | 375/300 |
| 6,130,910 A | 10/2000 | Anderson et al. | 375/238 |
| 6,144,354 A * | 11/2000 | Koyama et al. | 345/98 |
| 6,147,553 A | 11/2000 | Kolanek | 330/10 |
| 6,255,906 B1 | 7/2001 | Eidson et al. | 330/124 R |
| 6,377,784 B2 | 4/2002 | McCune | 455/108 |
| 6,411,655 B1 | 6/2002 | Holden et al. | 375/269 |
| 6,452,526 B2 * | 9/2002 | Sagawa et al. | 341/144 |
| 6,466,149 B2 * | 10/2002 | Tabler | 341/144 |
| 6,556,162 B2 * | 4/2003 | Brownlow et al. | 341/145 |
| 6,621,432 B1 * | 9/2003 | Ganci | 341/136 |
| 6,636,112 B1 | 10/2003 | McCune | 330/10 |

(Continued)

*Primary Examiner*—Jean Bruner Jeanglaude (57) ABSTRACT

An apparatus and method for amplifying a radiofrequency signal using a main Digital to Analog Converter (RFDAC) and a subordinate Digital to Analog Converter (Sub-DAC). The main RFDAC provides a first portion of a N-bit digital output, which specifies the amplification level of the radiofrequency signal, and the sub-DAC provides a second portion of the N-bit digital word. Together, the main RFDAC and the Sub-DAC convert a complete N-bit digital word, where N specifies the resolution of the output radiofrequency signal.

12 Claims, 3 Drawing Sheets

U.S. PATENT DOCUMENTS

| | | | |
|---|---|---|---|
| 6,658,238 B1 | 12/2003 | Ursenbach et al. | 455/102 |
| 6,738,432 B2 | 5/2004 | Pehlke et al. | 375/300 |
| 6,791,417 B2 | 9/2004 | Pengelly et al. | 330/295 |
| 6,799,020 B1 | 9/2004 | Heidmann et al. | 455/103 |
| 6,816,008 B2 | 11/2004 | Kontson | 330/51 |
| 2005/0030104 A1 | 2/2005 | Chen et al. | 330/295 |

* cited by examiner

SUB-RANGING DIGITAL TO ANALOG CONVERTER FOR RADIOFREQUENCY AMPLIFICATION

FIELD OF THE INVENTION

This present invention relates to radiofrequency amplifiers, and in particular, to a power amplifier circuit operating as a Multiplying Digital to Analog Converter (MDAC).

BACKGROUND OF THE INVENTION

A radiofrequency (RF) signal may be amplified by a monolithic Multiplying Digital to Analog Converter (MDAC) if a radiofrequency signal is input as a reference signal and a binary code (digital word) is utilized to control, or modulate, the amplitude of the RF output signal. Such an arrangement may be referred to as a Radio Frequency Digital to Analog Converter (RFDAC).

Figure 1:
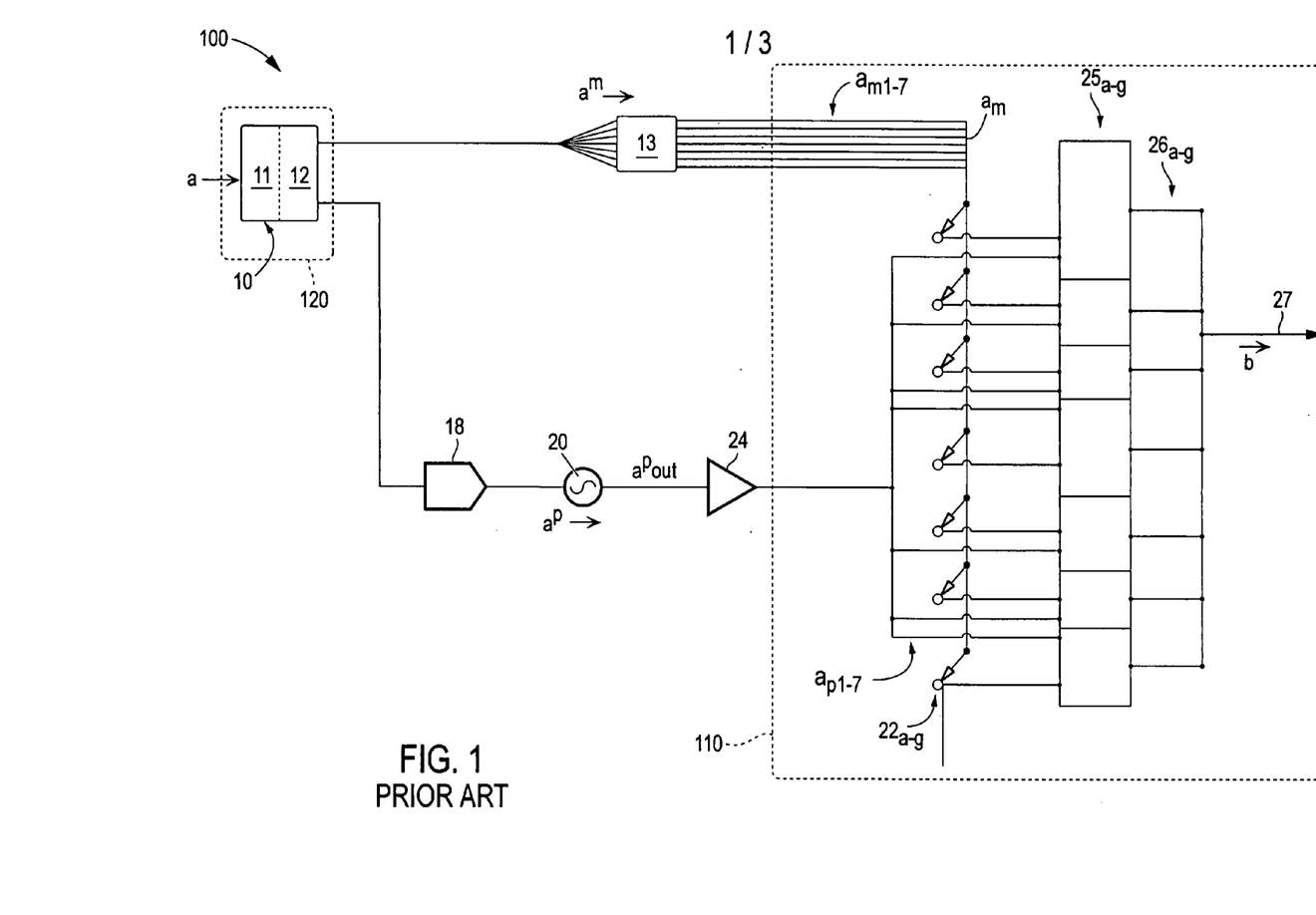
FIG. 1 shows a conventional polar transmitter including an RFDAC circuit.

FIG. 1 shows a polar transmitter 100 including an RFDAC circuit 110, and a signal processor circuit 120. The RFDAC circuit 110 is controlled by a digital amplitude signal ($a^m$), and driven by a phase modulated RF carrier signal ($a^p$) generated by the signal processor circuit 120. Particularly, an input IQ base band signal (a) is first applied to a digital signal processor 10 which converts the analog IQ base band signal to digital (through Analog to Digital Converter (ADC) 11), and also transforms the signal into amplitude ($a^m$) and phase ($a^p$) components (through Rectangular to Polar Converter (RPC) 12). In particular, the ADC 11 digitizes the input analog signal (a), and the RPC 12 translates the digitized wave into polar coordinates. RPC 12 outputs a digitized wave in polar coordinates, which takes the form R, P(sin) and P (cos), for example. In this example, the R coordinate represents an amplitude characteristic ($a^m$) of the digitized input wave. The P(sin) and P(cos) coordinates represent a phase characteristic ($a^p$) of the digitized input wave.

The amplitude ($a^m$) and phase ($a^p$) characteristics are then transmitted through separate paths in the polar transmitter 100. The amplitude characteristic ($a^m$) of the digitized input wave, comprising a digital word (DW) quantized into, for example, bits $B_0$ to $B_N$, with a Most Significant Bit ("MSB") to Least Significant Bit ("LSB"), is scaled and filtered, by a digital signal processor 13, to form shaped digital pulses which are supplied to the RFDAC circuit 110. The DW may be of varying lengths in various embodiments. In general, the longer the DW the greater the accuracy of reproduction of the input analog wave (a) at the output of the RFDAC circuit 110.

In the exemplary embodiment shown in FIG. 1, the digital amplitude signal ($a^m$) is transmitted as an N-bit (e.g., 7-bit) DW through the digital signal processor 13, which scales and filters the digital bits of the DW before providing the digital bits to the RFDAC circuit 110. Each bit of the N-bit DW corresponds to a separate component control line $a_{m1-N}$ (e.g., $a_{m1-7}$) in the RFDAC circuit 110. Each of the component control lines $a_{m1-N}$ are coupled to a separate control component 22 (e.g., switching transistors $22_{a-g}$), which feeds into another transistor 25 (e.g., $25_{a-g}$), which is turned ON or OFF depending on the particular bit value on the control component line. For example, if the DW corresponding to the digital amplitude signal ($a^m$) is "1110000," the first three (3) transistors (e.g., $25_{a-c}$) will be biased ON, and the last four (4) transistors (e.g., $25_{d-g}$) will be biased OFF. In this manner, the amplification of the input analog signal (a) may be effectively controlled, as explained below.

Figure 5:
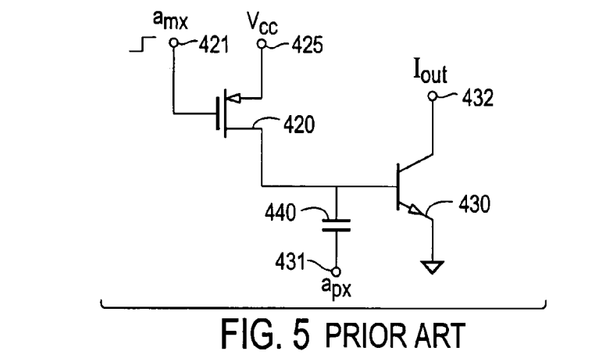
FIG. 5 shows an example implementation of the switch transistors and segment transistors of the RFDA circuit.

FIG. 5 shows an exemplary implementation of the switching transistors (transistors $22_{a-g}$) and segment transistors (transistors $25_{a-g}$) of the RFDAC circuit 110. For ease of reference, only one switching transistor 420 and one corresponding segment transistor 430 are shown in FIG. 5. Switching transistor 420 may correspond to one of switching transistors shown in FIG. 1 (e.g., $22_a$), and thus segment transistor 430 would correspond to the matching segment transistor (e.g., $25_a$). Switching transistor 420 may comprise a P-channel Metal Oxide Silicon transistor (PMOST), and segment transistor 430 may comprise an Indium Gallium Phosphide (InGaP) heterojunction bipolar junction transistor (HBJT).

The control signal $a_{mx}$ shown in FIG. 5 represents one digital bit which is applied to an input port 421 of the switching transistor 420, while an RF signal $a_{px}$ is applied to an input port 431 of the segment transistor 430. An output port 432 is coupled to the collector terminal of the segment transistor 430. This output port 432 port is in turn coupled to the corresponding output ports of the other segments that make up the RFDAC. An input port 425 connects a supply voltage ($V_{cc}$) to the source terminal of the switching transistor 420. A direct current (DC) blocking capacitor 440 couples the RF signal $a_{px}$ to the base terminal of the segment transistor 430.

When the source-gate voltage of the switching transistor 420 is less than its turn-on voltage, the switching transistor 420 is OFF and not conducting current, and thus the segment transistor 430 is also OFF since the RF signal current ($a_{px}$) alone is normally not enough to bias the segment transistor 430 into a region where transistor gain $h_{fe}$ is at its peak value. When the source-gate voltage of the switching transistor 420 exceeds its turn-on voltage, the switching transistor conducts current proportional to its width and length. This current flows into the base terminal of the segment transistor 430 along with the current due to the RF signal $a_{px}$. At this point, the combination of signal currents ($a_{mx}$ and $a_{px}$) is enough to bias the segment transistor 430 into a peak $h_{fe}$ region, and it is turned ON. The RF signal current ($a_{px}$) at the output of the segment transistor 430 is amplified by the transistor gain ($h_{fe}$), and flows out of output port 432.

Returning to FIG. 1, the digital phase signal ($a^p$) is modulated onto a wave by way of Digital to Analog Converter (DAC) 18 and synthesizer 20 before being provided to the RFDAC circuit 110. The synthesizer 20 preferably comprises a Voltage-Controlled Oscillator (VCO) in the exemplary embodiment. The synthesizer 20 provides an output wave ($a^p$out), which includes the phase information from the input wave (a). This output wave ($a^p$out) has a constant envelope (i.e., it has no amplitude variations, yet it has phase characteristics of the original input wave). The output wave ($a^p$out) may be further amplified by amplifier 24 before being provided to the plurality of transistors $25_{a-g}$ on respective phase signal lines $a_{p1-7}$.

Regulation of the transistors $25_{a-g}$ may be accomplished by providing the DW to the control components (e.g., switching transistors $22_{a-g}$). Each of the control components $22_{a-g}$ preferably comprises a transistor acting as a current source. The control components $22_{a-g}$ are switched by bits of the DW generated from the digital amplitude signal ($a^m$). For example, if a bit (e.g., the bit on line $a_{m1}$) of the DW is a logic "1" (e.g., HIGH), the corresponding control component (e.g., $22_a$) is switched ON, and so current flows from that control component to respective transistor segment (e.g., $25_a$). Similarly, if the same bit (e.g., the bit on line $a_{m1}$) of the DW is a logic "0" (e.g., LOW), the corresponding control component (e.g., $22_a$) is switched OFF, and so current is prevented from flowing through that control component to respective transistor segment (e.g., $25_a$). The current from all transistor segments $25_{a-g}$ is then combined at the respective transistor outputs lines $26_{a-g}$, and provided as an output signal (b) on output signal line 27. Thus, by controlling the value of the DW, the amplification of the digital phase signal ($a^p$) may be accurately controlled using the digital amplitude signal ($a^m$), thereby allowing reproduction of an amplified version of the input analog signal (a) at the output of the RFDAC circuit 110.

The resolution of the above-described RFDAC circuit 110 is defined by the number of bits used in the controlling code (i.e., N-bit digital word), while the output equals the phase portion of the input radiofrequency reference signal '$a^p$' multiplied by a fraction equal to the value of the input code divided by the maximum value. For example, the following equation defines the ideal value of the RFDAC output signal:

$$\text{Out} = V_{RF}/2^{N} * [2^0 * D_0 + 2^1 * D_1 + 2^2 * D_2 + \ldots 2^{N-1} * D_{N-1}], \text{ where} \quad (\text{Eq. 1})$$

Out=RFDAC output (voltage or current), $V_{RF}$=input reference voltage signal (shown as signal '$a^p$' in FIG. 1), $D_0$=Least Significant Bit (LSB) Value (e.g., 0 or 1), $D_{1, 2, etc.}$=Bit Values Between LSB and MSB (e.g., 0 or 1), $D_{N-1}$=Most Significant Bit (MSB) Value (e.g., 0 or 1), and, N=resolution in bits Thus, if the resolution of the RFDAC were 3-bit, the output voltage would be equivalent to the input reference voltage (e.g., $V_{RF}$) multiplied by a factor defined by [($D_0$+ 2*$D_1$+4*$D_2$)/8]. Accordingly, the DW "010" corresponds to a multiplication factor of ¼, or in other words, the output voltage is equal to one-fourth (¼) of the input voltage.

An RFDAC monolithic microwave integrated circuit (MMIC) is constructed using an RF compatible process, such as a Gallium Arsenide (GaAs) process, a Silicon Germanium (SiGe) process, or an RF Complementary Metal Oxide Semiconductor (CMOS) process. For example, in an Indium Gallium Phosphide (InGaP) heterojunction bipolar process, the RFDAC is constructed from Heterojunction Bipolar Junction Transistors (HBJTs). A key design parameter for HBJT devices is the unity gain transition frequency ($f_T$). $f_T$ is maximum when the HBJT emitter area is optimized for the collector current that flows in the device. Moreover, the emitter area scales with the emitter current. Thus, speed and output current are two parameters, which drive the design of the RFDAC. Other parameters, such as noise and distortion, are also deterministic in the design. Quantization noise requirements set the minimum required resolution (i.e., number of bits in the n-BIT digital word) of the RFDAC.

In almost all integrated circuit designs, speed affects performance while die size affects cost. The physical area of the RFDAC is determined primarily by the maximum output current, and the highest output frequency defined. However, resolution also affects the size, since with any process, the core devices (along with interconnections) require minimum spacing and pitch values. For example, a 2 picofarad (pF) Metal-Insulator-Metal (MIM) capacitor takes up less space if it is constructed as one device than if it were constructed from two (2) 1 pF devices in parallel. Following this rationale, a 12-bit RFDAC with the same full-scale output as a 7-bit RFDAC should take up more area because of the spacing/pitch requirements, but also because there are more input circuits. Each input requires a pad, which increases die area. In addition, more pads require more bond wires and package pins.

Thus, there is presently a need for an RFDAC design which occupies less die space but still permits multi-bit resolutions (e.g., 10-bit digital words or greater).

SUMMARY OF THE INVENTION

An exemplary embodiment of the present invention comprises a circuit including a first digital to analog converter for providing amplification of a signal based on a digital control word, and a second digital to analog converter, wherein a first plurality of bits representing a first portion of the digital control word are supplied to the first digital to analog converter, and a second plurality of bits representing a second portion of the digital control word are supplied to the second digital to analog converter, and wherein the second digital to analog converter supplies an analog representation of the second plurality of bits to the first digital to analog converter.

An exemplary embodiment of the present invention also comprises a method for amplifying a signal, including the steps of generating a first plurality of bit values based on a signal, generating a second plurality of bit values based on the signal, combining the first and second pluralities of bit values to form a digital control word, and modulating the amplitude of a signal through application of the digital control word.

An exemplary embodiment of the present invention also comprises a circuit including a digital processing circuit coupled to an input terminal for converting an analog signal into at least two digital signals, at least one of said digital signals comprising an amplitude signal, and at least one of said digital signals comprising a phase signal, and a digital to analog circuit for applying an N-bit digital word to the phase signal, said digital to analog circuit comprising a first digital to analog converter and a second digital to analog converter, wherein a first plurality of bits representative of a first portion of the N-bit digital word are supplied to the first digital to analog converter, and wherein a second plurality of bits representative of a second portion of the N-bit digital word are supplied to the second digital to analog converter, and wherein the second digital to analog converter supplies an analog representation of the second plurality of bits of the N-bit digital word to the first digital to analog converter.

An exemplary embodiment of the present invention also comprises a circuit including a first digital to analog converter, said first digital to analog converter controlled by a most significant digital word, and a second digital to analog converter, said second digital to analog converter controlled by a least significant digital word, wherein an output of the second digital to analog converter is combined with the most significant digital word from the first digital to analog converter to form a composite output digital word.

An exemplary embodiment of the present invention also comprises a circuit including a first digital to analog converter, said first digital to analog converter controlled by a most significant digital word, and a second digital to analog converter, said second digital to analog converter controlled by a least significant digital word, wherein an output of the second digital to analog converter is applied to a least significant bit input of the first digital to analog converter, so that the output of the first digital to analog converter is finely controlled by the least significant digital word and coarsely controlled by the most significant digital word.

An exemplary embodiment of the present invention also comprises a circuit including a digital processing circuit coupled to an input terminal for converting an analog signal into at least two digital signals, at least one of said digital signals comprising an amplitude signal, and at least one of said digital signals comprising a phase signal, and a digital to analog circuit including a first digital to analog converter, said first digital to analog converter controlled by a most significant digital word, and a second digital to analog converter, said second digital to analog converter controlled by a least significant digital word, wherein an output of the second digital to analog converter is combined with the most significant digital word from the first digital to analog converter to form a composite output.

DETAILED DESCRIPTION

The die size of a monolithic Radiofrequency Digital to Analog Converter (RFDAC) may be minimized if the RFDAC is built as a 'sub-ranging' Multiplying Digital to Analog Converter (MDAC), rather than as a 'fully integrated' MDAC. Particularly, if the RFDAC is divided into two or more sub-DACs, with each sub-DAC establishing only a portion of the required N-bit digital word, die size may be decreased due to the fact that the sub-DACs can occupy less area than the single 'fully integrated' RFDAC.

Figure 2:
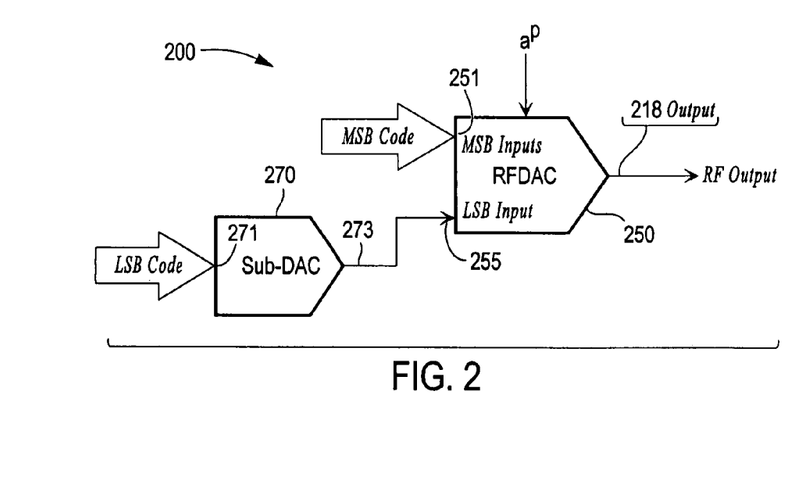
FIG. 2 shows a block diagram of a sub-ranging RFDAC circuit according to an exemplary embodiment of the present invention.

FIG. 2 shows an RFDAC circuit 200, which utilizes a sub-ranging Digital to Analog Converter (DAC), according to an exemplary embodiment of the present invention. The RFDAC circuit 200 includes two DACs, one of which is an RFDAC 250, which supplies a coarse output signal using the Most Significant Bits (MSBs) of a N-bit digital word, and the other of which is a 'Sub-DAC' 270, which supplies a fine output signal using the Least Significant Bits (LSBs) of the N-bit digital word. In other words, the RFDAC 250 converts a first plurality of input bits to supply a first portion (e.g., the Most Significant portion) of an N-bit digital word, and Sub-DAC 270 converts a second plurality of input bits to supply a second portion (e.g., the Least Significant portion) of the N-bit digital word, such that together the RFDAC 250 and the Sub-DAC 270 supply the entire N-bit digital word.

The RFDAC 250 plus the Sub-DAC 270 together supply an N-bit digital word with an effective resolution equal to the sum of their individual resolutions, less one (1) bit. For example, a 7-bit RFDAC 250 plus a 6-bit Sub-DAC 270 yield an effective resolution of twelve (12) bits.

The RFDAC 250 receives a digital phase signal ($a^p$), which is modulated by the N-bit digital word to produce an output signal (RF Output) at output port 218. A digital signal representing the Most Significant Bits of the N-bit digital word is provided directly to the RFDAC 250 at first input port 251 (referenced as "MSB Code" in FIG. 2). The analog equivalent of the Least Significant Bits of the N-bit digital word is provided at a second input port 255 of the RFDAC 250. In particular, a digital signal representing the Least Significant Bits of the N-bit digital word is provided directly to the Sub-DAC 270 at first input port 271 (referenced as "LSB Code" in FIG. 2), which in turn, provides an analog signal representing the Least Significant Bits at a first output port 273. The first output port 273 of the Sub-DAC 270 is coupled to the second input port 255 of the RFDAC 250, so that in effect the Least Significant Bits are combined with the Most Significant Bits (provided at first input 251) to form the N-bit digital word. The converted N-bit digital word is subsequently used to modulate the digital phase signal ($a^p$), and generate the output signal (RF Output).

The ability to accurately produce the output signal (RF Output) is determined in part by the overall 'weight' of each DAC (e.g., RFDAC 250 and Sub-DAC 270). In the above-described exemplary embodiment, the full-scale weight of the Sub-DAC 270 is equal to twice the weight of the RFDAC 250 Least Significant Bit (LSB). The effective LSB weight of the Sub-DAC 270 should equal the Full Scale Range ("FSR") of the composite RFDAC circuit 200 divided by a factor determined by the desired overall resolution in bits (e.g., the integer 2 raised to a power equal to the total number of bits N). The FSR preferably equals the full-scale range (voltage or current) of the RF signal at the output of the composite RFDAC circuit 200. In the above-described exemplary embodiment, the FSR defines the maximum output voltage range of the RFDAC circuit 200 (i.e., the RFDAC 250/Sub-DAC 270 combination) between the codes 000 . . 0 to 111 . . . 1 inclusive.

The RFDAC 250 has applied thereto an RF input voltage (e.g., $V_{RF}$) which is scaled by the RFDAC 250 and the Sub-DAC 270 respectively to give the FSR output voltage range. It will be noted by those of ordinary skill in the art that virtually all DACs have a maximum output that is one (1) LSB less than their FSR, because the FSR refers to the range, which includes the zero output.

The effective LSB weight of the Sub-DAC 270 may be defined by the following equation:

$$LSB_{Sub-DAC} = FSR/2^N, \qquad (Eq.\ 2)$$

where N is the desired resolution (i.e., number of bits) of the composite system (e.g., RFDAC circuit 200) and FSR is the full scale range of the composite (e.g., RFDAC 250 plus Sub-DAC 270) system.

In the above example, the effective Sub-DAC LSB would equal $FSR/2^{12}$ (FSR/4096). The LSB of the RFDAC 250 has a weight which is $2^F$ times that of the Sub-DAC 270 effective LSB, where F is the resolution of the Sub-DAC 270 (e.g., $2^6=64$, in the above example). In particular, the Sub-DAC 270 described above has sixty-four (64) possible output values, the smallest of which equals zero (0), and the largest of which equals 63*FSR/4096. Put another way, the Sub-DAC 270 has its own full scale range equal to 64*FSR/4096, or FSR/64, where FSR is the full-scale range of the RFDAC circuit 200 (i.e., RFDAC 250+Sub-DAC 270).

The Sub-DAC 270 output replaces the $D_0$ term in Equation 1 above so that instead of having a value of either 0 or 1 for $D_0$, the new value of $D_0$ can equal any value between 0 and 1 (normalized) with a resolution equal to the Sub-DAC LSB (e.g., $FSR_{Sub-DAC}/2^6$, in the above example). In other words, the new value of $D_0$ can represent multiple bits, rather than just a single bit. Nominally, the $FSR_{Sub-DAC}$ (i.e., the FSR of the Sub-DAC 270 alone) is equivalent to two (2) LSBs of the RFDAC 250. The Sub-DAC 270 output is a single multi-level signal containing the LSB portion of the DW (which may be one or more bits), and works in conjunction with the other $D_x$ terms in the digital word (See Eq. 1).

The $FSR_{Sub-DAC}$ of the Sub-DAC 270 should also take into account the scaling properties of any input processing circuitry (not shown in FIG. 2) of the RFDAC 250 LSB input. For example, if the input processing circuitry of the RFDAC 250 causes an attenuation of its bit inputs by a factor "k," then the $FSR_{Sub-DAC}$ of the Sub-DAC 270 must have k as a factor. An advantage associated with having an attenuation factor k in the bit input processing circuit is that the $FSR_{Sub-DAC}$ range of the Sub-DAC 270 may be larger by such a factor k, and so manufacturing non-idealities (that are inversely proportional to the size of the circuit) are thus attenuated by the bit input processing circuit. In other words, the Sub-DAC 270 errors are attenuated, and thus the output of the overall RFDAC circuit 200 is more linear.

Another advantage of the sub-ranging RFDAC circuit 200 is that a high resolution MDAC (e.g., 10-bit or greater) can be built from two lower resolution DACs. Particularly, by using a Sub-DAC 270 which represents multiple bits on a single bit line, a lower resolution DAC may be used for the Sub-DAC. Another advantage is that the Sub-DAC 270 can be constructed on a different substrate from the RFDAC 250, along with the MSB driving circuits and any digital signal processing functions.

Thus, an N-bit RFDAC circuit 200 including a main RFDAC 250 and a Sub-DAC 270 may be constructed in an InGaP HBT process with fewer input processing circuits, input pads, and bond wires resulting in a less costly implementation than if a full scale, N-bit RFDAC was constructed.

The following equation sets forth the output voltage ($V_{out}$) of the above-described RFDAC circuit 200:

$$V_{out}=(V_{RF}*CC)/2^C+(V_{RF}*CF)/2^{(C+F-1)}, \text{ where} \qquad (Eq. 3)$$

$V_{out}$=output voltage,
$V_{RF}$=input reference voltage (represented by the digital phase signal ($a^p$) in FIG. 2),
CC=Most Significant Bit (MSB) binary code input to RFDAC 250,
C=Most Significant Bit (MSB) resolution of RFDAC 250,
CF=Least Significant Bit (LSB) binary code input to Sub-DAC 270, and
F=Least Significant Bit (LSB) resolution of Sub-DAC 270.

For example, consider a 12-bit system with a 7-bit RFDAC (250) and a 6-bit Sub-DAC (270), where $V_{RF}$=1 Volt (V) peak to peak, CC=0–7EH (hexadecimal), C=7 bits, CF=0–3FH (hexadecimal), F=6 bits. It will be noted by those of ordinary skill in the art that the upper end of the range for the Most Significant Bit (MSB) binary code input to RFDAC (250) is 7EH (binary 111 1110), rather than binary 111 1111. This is due to the fact that the Least Significant Bit (LSB) of the RFDAC code is supplied by the Sub-DAC 270.

For instance, for a 'full scale' (maximum) output, the code for the RFDAC (250) and the Sub-DAC (270) would be as follows:

| | |
|---|---:|
| RFDAC MSB Code (7-bit): | 1111110 |
| Sub-DAC LSB Code (6-bit) | 111111 |
| Total (12-bit) | 111111111111 |

An alternative equation for defining the voltage output of the composite RFDAC circuit 200 based on Equation 1, where the LSB value ($D_0$) is replaced by the actual LSB binary code input (CF), may be stated as follows:

$$V^1_{out}=V_{RF}/2^{N}*[2^0*CF+2^1*D_1+2^2*D_2+ \ldots 2^{N-1}*D_{N-1}], \text{ where} \qquad (Eq. 4)$$

$V^1_{out}$=output voltage,
$V_{RF}$=reference voltage,
CF=Least Significant Bit (LSB) binary code input to Sub-DAC 270,
$D_{1, 2, etc.}$=Bit Values Between LSB and MSB (e.g., 0 or 1),
$D_{N-1}$=Most Significant Bit (MSB) Value (e.g., 0 or 1), and
N=resolution in bits.

Figure 3:
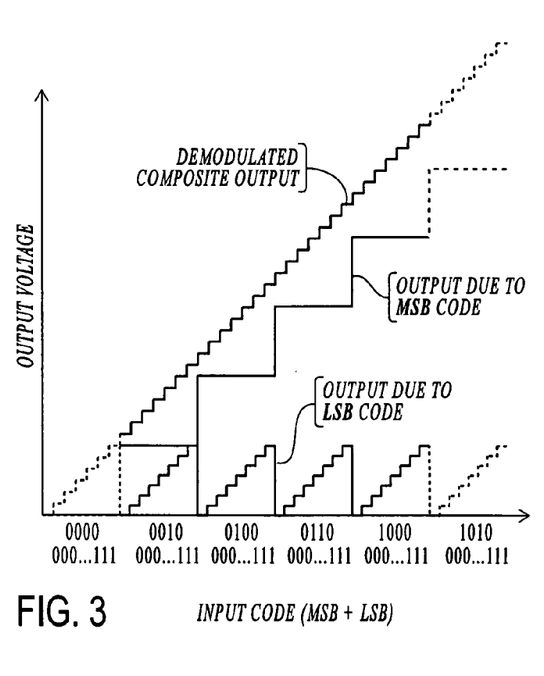
FIG. 3 shows a graph plotting output voltage of a sub-ranging RFDAC against input code.

FIG. 3 is a graph showing the transfer function of an exemplary 6-bit sub-ranging RFDAC implementation using a 4-bit RFDAC and a 3-bit Sub-DAC. The X-axis of FIG. 3 shows both the RFDAC 250 and Sub-DAC 270 codes. The RFDAC 250 code is shown in larger type above the Sub-DAC 270 code, which is shown as a range from 000 . . 0 to 111 . . 1. The 0000, 0010, etc. signify the RFDAC 250 code incrementing through integers 0, 2, 4, 6, etc. For each RFDAC 250 code value there is a range of possible Sub-DAC 270 codes adding to the RFDAC code value.

Figure 4:
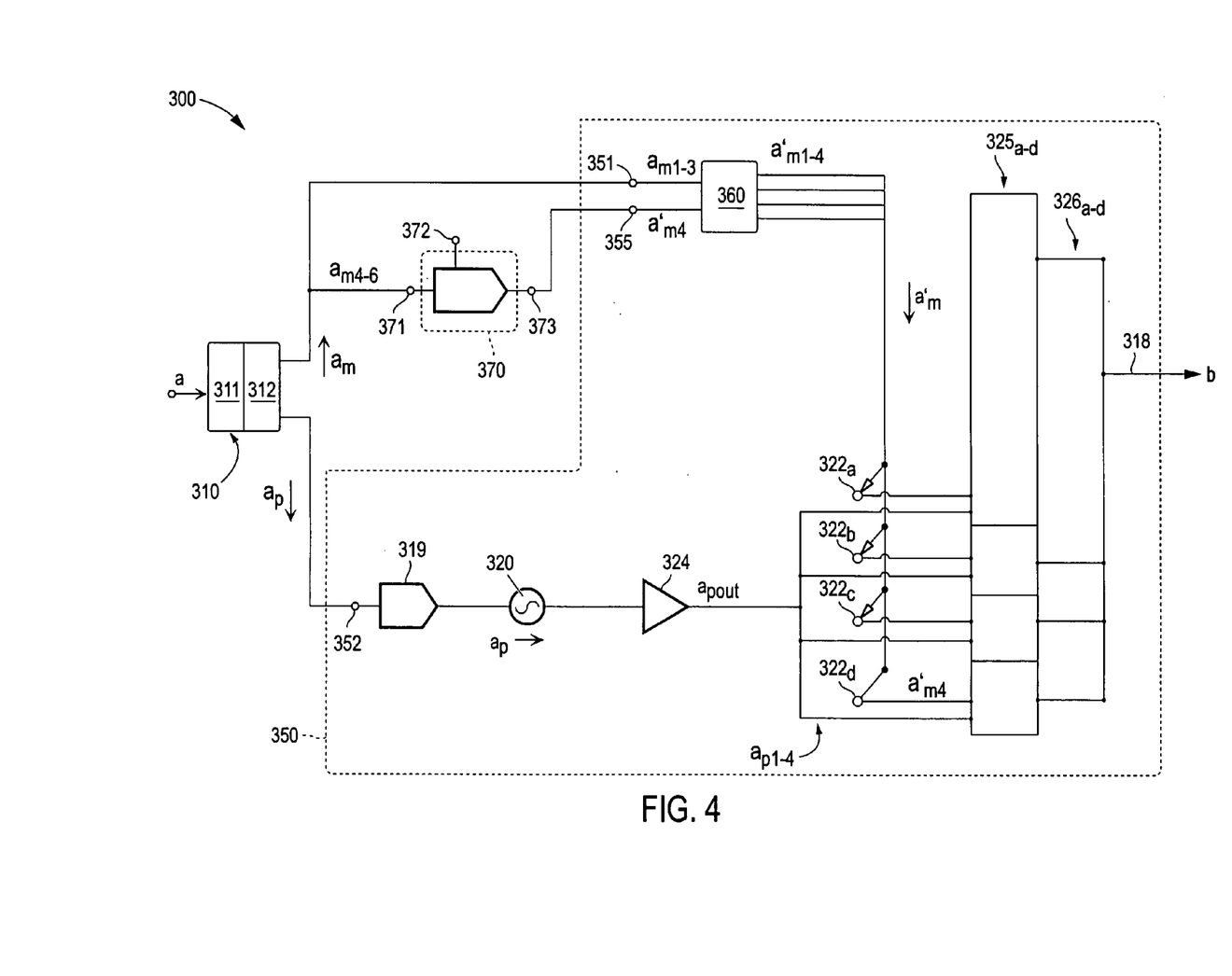
FIG. 4 shows a schematic diagram of a sub-ranging RFDAC circuit according to an exemplary embodiment of the present invention.

FIG. 4 shows a specific exemplary RFDAC circuit 300 based on the generalized structure of the RFDAC circuit 200 shown in FIG. 2, and like reference numerals correspond to like elements. Particularly, the RFDAC circuit 300 comprises a 6-bit sub-ranging RFDAC circuit which includes a 4-bit main RFDAC 350, and a 3-bit Sub-DAC 370. The 4-bit main RFDAC 350 and the 3-bit Sub-DAC 370 are supplied with bits of an input Digital Word (DW) generated by a digital signal processor 310. The digital signal processor 310 converts an analog baseband signal (a) to a digital representation of the analog signal, and also divides the input analog signal into amplitude ($a^m$) and phase ($a^p$) components. In particular, the digital signal processor 310 includes an Analog to Digital Converter (ADC) 311, which digitizes the input analog signal (a), and a Rectangular to Polar Converter (RPC) 312, which translates the digitized wave into polar coordinates. For example, RPC 312 outputs a digitized wave in polar coordinates, which takes the form R, P(sin) and P(cos). In this example, the R coordinate represents an amplitude characteristic ($a^m$) of the input wave in digital form (a 6-bit DW). The P(sin) and P(cos) coordinates represent a phase characteristic ($a^p$) of the digitized input wave.

The 4-bit RFDAC 350 receives the Most Significant Bits (MSBs) of the input DW generated by the digital signal processor 310, and the 3-bit Sub-DAC receives the Least Significant Bits (LSBs) of the input DW. For example, for an input DW="010100", the 4-bit RFDAC 350 receives bits "010", and the 3-bit Sub-DAC 370 receives bits "100."

The Sub-DAC 370 essentially comprises a Digital to Analog Converter (DAC) for supplying an analog signal representing the LSBs of the input DW to the main RFDAC 350. The Sub-DAC 370 includes an LSB input port 371, for receiving bits representing the LSBs of the input DW (e.g., bits "100" of DW "010100"). The Sub-DAC 370 also includes a reference input port 372 for receiving an analog reference signal, and an output port 373. The output port 373 provides the analog representation of the LSBs of the input DW provided at LSB input port 371 (e.g., "100"), multiplied by the reference signal. The output port 373 of the Sub-DAC 370 is coupled to a Sub-DAC/LSB input port 355 of the main RFDAC 350.

The main RFDAC 350 includes a MSB input port 351, the Sub-DAC/LSB input port 355, and a phase signal ($a^p$) input port 352. The MSB input port 351 receives bits representing the MSBs of the input DW (e.g., bits "010" of DW "010100"). The Sub-DAC/LSB input port 355 receives the analog signal generated by the Sub-DAC 370 corresponding to the LSB bits of the DW, and supplies such analog signal to a signal processor 360 in the main RFDAC 350. The MSB digital bits of the DW and the Sub-DAC 370 analog output signal are scaled and filtered by the signal processor 360 such that the resulting outputs on bit lines $a'_{m1-4}$ have the proper amplitudes.

For example, the MSB portion of the DW (e.g., "010") is provided at the output of signal processor 360 on bit lines $a'_{m1-3}$, while the LSB portion of the DW (e.g., "100") is provided at the output of signal processor 360 on bit line $a'_{m4}$. So, bit lines $a'_{m1-3}$ each represent a single bit (e.g., bits "0", "1" and "0" of "010") of the DW. However, bit line $a'_{m4}$ represents all of the bits of the LSB portion of the DW (e.g., bits "1", "0" and "0" of "100") which were provided in analog form at the Sub-DAC LSB input port 355. Accordingly, a composite equivalent 6-bit Digital Word (DW) is provided on bit lines $a'_{m1-4}$. The phase signal input port 352 receives a digital phase signal ($a^p$), which is modulated by the DW to generate an amplitude modulated output signal at output port 318, as explained below.

The individual bits of the DW ($a_m$) are carried on bit lines $a_{m1-3}$/$a_{m4}$, in the exemplary 4-bit main RFDAC 350, and are coupled to a plurality of respective transistors $325_{a-d}$ through a plurality of control components $322_{a-d}$. Particularly, the transistors $325_{a-c}$ are turned ON or OFF depending on the particular bit value on each of the bit lines $a_{m1-3}$, while transistor $325_d$'s output varies depending on the LSB signal amplitude on $a'_{m4}$. For example, if the DW ($a_m$) carries the bit stream "111000" on bit lines $a_{m1-6}$, the first three (3) transistors (e.g., $325_{a-c}$) will be biased ON, and the last one (1) transistor (e.g., $325_d$) will be biased OFF.

Also connected to the transistors $325_{a-d}$ are respective individual phase signal lines $a_{p1-4}$, which are coupled to the digital phase signal ($a^p$) applied at phase signal input port 352. The digital phase signal ($a^p$) is modulated by the respective bits of the DW ($a_m$) to generate an amplitude modulated output signal at output port 318.

The digital phase signal ($a^p$) is modulated onto a wave by way of Digital to Analog Converter (DAC) 319 and synthesizer 320. The synthesizer 320 preferably comprises a Voltage-Controlled Oscillator (VCO) in the exemplary embodiment. The synthesizer 320 is buffered by amplifier 324 which provides an output wave ($a^p$out), which includes the phase information. This output wave ($a^p$out) has a constant envelope (i.e., it has no amplitude variations, yet it has phase characteristics of the original input wave). The output wave ($a^p$out) is provided to the plurality of transistors $325_{a-d}$ on respective signal lines $a_{p1-4}$.

Regulation of the transistors $325_{a-d}$ may be accomplished by providing the digital word (DW), through the Sub-DAC 370 and signal processor 360, to the control components (e.g., switching transistors $322_{a-d}$). Each of the control components $322_{a-d}$ preferably comprises a transistor acting as a current source. The control components $322_{a-d}$ are switched by bits of the DW generated from the digital amplitude signal ($a^m$). For example, if a bit (e.g., the bit on line $a_{m1}$) of the DW is a logic "1" (e.g., HIGH), the corresponding control component (e.g., $322_a$) is switched ON, and so current flows from that control component to respective transistor segment (e.g., $325_a$). Similarly, if the same bit (e.g., the bit on line $a_{m1}$) of the DW is a logic "0" (e.g., LOW), the corresponding control component (e.g., $322_a$) is switched OFF, and so current is prevented from flowing through that control component to respective transistor segment (e.g., $325_a$). The current from all transistor segments $325_{a-d}$ is then combined at the respective transistor output lines $326_{a-d}$, and provided as an output signal (b) at output port 318. Thus, by controlling the value of the DW, the amplification of the digital phase signal ($a^p$) may be accurately controlled using the digital amplitude signal ($a^m$), thereby allowing generation of a desired signal.

Although the invention is described above with reference to one (1) main RFDAC (250) and one (1) Sub-DAC (270), those of ordinary skill in the art will recognize that the principles discussed herein may be applied to a system including any number of main RFDACs and any number of Sub-DACs.

Although the invention has been described in terms of exemplary embodiments, it is not limited thereto. Rather, the appended claims should be construed broadly to include other variants and embodiments of the invention, which may be made by those skilled in the art without departing from the scope and range of equivalents of the invention.

What is claimed is:

1. A circuit comprising:
   a first digital to analog converter for providing amplification of a signal based on a digital control word; and,
   a second digital to analog converter,
   wherein a first plurality of bits representing the most significant bits of the digital control word are supplied to the first digital to analog converter, and a second plurality of bits representing the least significant bits of the digital control word are supplied to the second digital to analog converter, and
   wherein the second digital to analog converter supplies an analog representation of the second plurality of bits to the first digital to analog converter.

2. The circuit of claim 1, wherein the first digital to analog converter includes a signal processor for receiving the first plurality of bits and the analog representation of the second plurality of bits.

3. The circuit of claim 2, wherein the signal processor includes M output bit lines, such that each bit of the first plurality of bits are separately provided on M–1 of the output bit lines, and a composite signal representing the second plurality of bits is provided on the remaining output bit line.

4. The circuit of claim 1, wherein the first plurality of bits and the second plurality of bits are combined in the first digital to analog converter to form the digital control word.

5. A method for amplifying a signal, comprising the steps of:
   generating a first plurality of bit values representative of the most significant bits of a digital signal;
   generating a second plurality of bit values representative of the least significant bits of the digital signal;
   converting the second plurality of bit values into a first analog signal; and,
   generating a second analog signal based on the first analog signal and the first plurality of bit values.

6. The method of claim 5, further comprising:
   combining the first and second pluralities of bit values to form a digital control word;
   wherein the digital control word is comprised of N bits, where N is equal to the number of bits in the first plurality of bits plus the number of bits in the second plurality of bits.

7. The method of claim 6, wherein the first analog signal represents a single bit of the digital word.

8. A circuit comprising:
a digital processing circuit coupled to an input terminal for converting an analog signal into at least two digital signals, at least one of said digital signals comprising an amplitude signal, and at least one of said digital signals comprising a phase signal; and,
a digital to analog circuit including:
a first digital to analog converter, said first digital to analog converter controlled by a most significant digital word; and
a second digital to analog converter, said second digital to analog converter controlled by a least significant digital word,
wherein an output of the second digital to analog converter is combined with the most significant digital word to form a composite output.

9. A circuit comprising:
a first digital to analog converter for providing amplification of a signal based on a digital control word; and,
a second digital to analog converter,
wherein a first plurality of bits representing the most significant bits of the digital control word are supplied to the first digital to analog converter, and a second plurality of bits representing the least significant bits of the digital control word are supplied to the second digital to analog converter;
wherein the second digital to analog converter supplies an analog representation of the second plurality of bits to the first digital to analog converter; and
wherein an output voltage of the circuit is defined by the following equation:

$$V_{out} = (V_{RF} * CC)/2^C + (V_{RF} * CF)/2^{(C+F-1)},$$

where $V_{out}$=output voltage, $V_{RF}$=voltage of the signal to be amplified, CC=Most Significant Bit (MSB) binary code input to the first digital to analog converter, C=Most Significant Bit (MSB) resolution of the first digital to analog converter, CF=Least Significant Bit (LSB) binary code input to the second digital to analog converter, and F=Least Significant Bit (LSB) resolution of the second digital to analog converter.

10. A circuit comprising:
a first digital to analog converter, said first digital to analog converter controlled by a most significant digital word; and
a second digital to analog converter, said second digital to analog converter controlled by a least significant digital word,
wherein an output of the second digital to analog converter is applied to a least significant bit input of the first digital to analog converter, so that the output of the first digital to analog converter is finely controlled by the least significant digital word and coarsely controlled by the most significant digital word.

11. A circuit comprising:
a first digital to analog converter, said first digital to analog converter controlled by a most significant digital word; and
a second digital to analog converter, said second digital to analog converter controlled by a least significant digital word,
wherein an output of the second digital to analog converter is combined with the most significant digital word to form a composite output digital word.

12. A circuit comprising:
a digital processing circuit coupled to an input terminal for converting an analog signal into at least two digital signals, at least one of said digital signals comprising an amplitude signal, and at least one of said digital signals comprising a phase signal; and,
a digital to analog circuit for applying an N-bit digital word to the phase signal, said digital to analog circuit comprising a first digital to analog converter and a second digital to analog converter, wherein a first plurality of bits representative of the most significant bits of the N-bit digital word are supplied to the first digital to analog converter, and wherein a second plurality of bits representative of the least significant bits of the N-bit digital word are supplied to the second digital to analog converter, and wherein the second digital to analog converter supplies an analog representation of the second plurality of bits of the N-bit digital word to the first digital to analog converter.

* * * * *